(12) United States Patent
Chung et al.

(10) Patent No.: US 12,349,421 B2
(45) Date of Patent: Jul. 1, 2025

(54) 2D CHANNEL WITH SELF-ALIGNED SOURCE/DRAIN

(71) Applicant: Taiwan Semiconductor Manufacturing Co., Ltd., Hsinchu (TW)

(72) Inventors: Cheng-Ting Chung, Hsinchu (TW); Jin Cai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 569 days.

(21) Appl. No.: 17/581,789

(22) Filed: Jan. 21, 2022

(65) Prior Publication Data
US 2023/0037927 A1 Feb. 9, 2023

Related U.S. Application Data

(60) Provisional application No. 63/230,420, filed on Aug. 6, 2021.

(51) Int. Cl.
| | | |
|---|---|---|
| *H10D 48/36* | (2025.01) |
| *H01L 21/02* | (2006.01) |
| *H10D 30/67* | (2025.01) |
| *H10D 62/80* | (2025.01) |
| *H10D 99/00* | (2025.01) |
| *H10K 10/46* | (2023.01) |
| *H10K 85/20* | (2023.01) |

(52) U.S. Cl.
CPC ..... *H10D 48/362* (2025.01); *H01L 21/02568* (2013.01); *H10D 30/6713* (2025.01); *H10D 30/6757* (2025.01); *H10D 62/80* (2025.01); *H10D 99/00* (2025.01); *H10K 10/464* (2023.02); *H10K 10/484* (2023.02); *H10K 85/221* (2023.02)

(58) Field of Classification Search
CPC .......... H01L 29/7606; H01L 21/02568; H01L 29/24; H01L 29/66969; H01L 29/78618; H01L 29/78696; H01L 29/778; H01L 29/78681; H01L 29/1602; H01L 29/1606; H01L 29/66045; H01L 29/0843–0891; H01L 29/66636–66643; H01L 21/823418–823425; H10K 10/464; H10K 10/484; H10K 85/221; H10D 48/362; H10D 30/6713; H10D 30/6757; H10D 62/80; H10D 99/00; H10D 84/032; H10D 30/47
See application file for complete search history.

(56) References Cited

U.S. PATENT DOCUMENTS

| | | | | |
|---|---|---|---|---|
| 10,734,531 | B2 * | 8/2020 | Das | H01L 29/1033 |
| 2018/0151448 | A1 * | 5/2018 | Wang | H01L 29/0673 |
| 2020/0388685 | A1 * | 12/2020 | Sharma | H01L 29/785 |
| 2022/0102495 | A1 * | 3/2022 | Maxey | H01L 29/7781 |

* cited by examiner

*Primary Examiner* — Shahed Ahmed
(74) *Attorney, Agent, or Firm* — Seed IP Law Group

(57) ABSTRACT

An integrated circuit includes a two-dimensional transistor having a channel region having lateral ends in contact with first and second source/drain regions. The transistor includes a gate dielectric that is aligned with the lateral ends of the channel region. The transistor includes a gate metal on the gate dielectric. The gate metal has a relatively small lateral overlap of the first and second source/drain regions.

20 Claims, 14 Drawing Sheets

2D CHANNEL WITH SELF-ALIGNED SOURCE/DRAIN

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate. However, as transistor sizes continue to scale downward, managing short channel effects in transistors can become very difficult. Accordingly, short channel control can become a bottleneck of device scaling.

Two-dimensional (2D) transistors such as 2D transition metal dichalcogenide (TMD) and carbon nanotube (CNT) transistors are promising candidates for further scaling due to their ultra-thin channel and excellent carrier transport property. However, source drain doping is difficult to achieve since traditional implantation and diffusion methods may not available in 2D-TMD and CNT transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
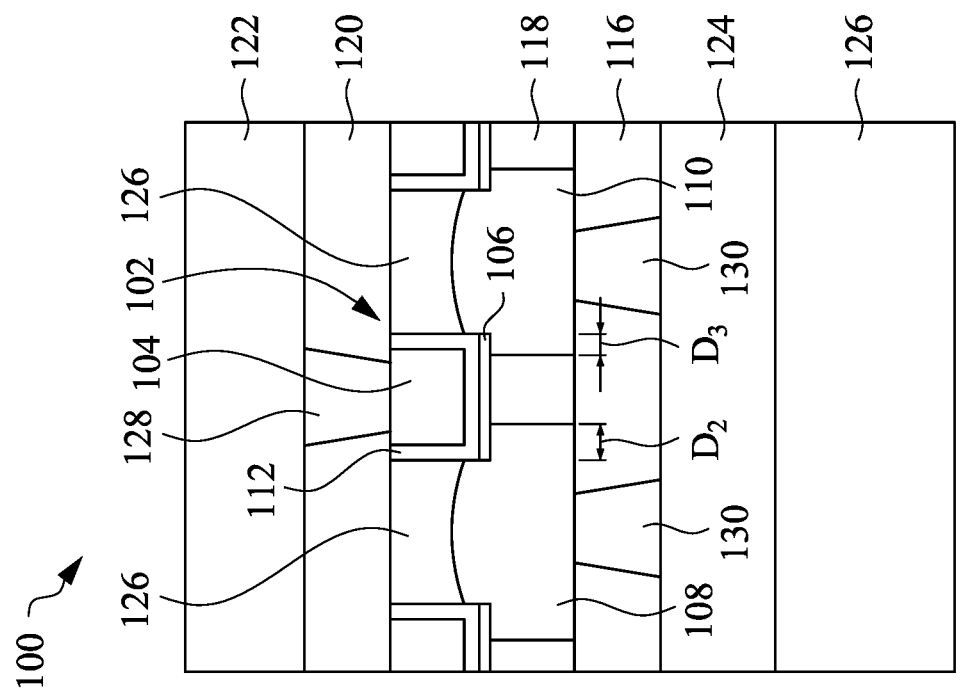
FIG. 1B is a cross-sectional view of an integrated circuit including a 2D transistor, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with 2D transistors having robust electrical characteristics. The channel region and the gate electrode of each transistor are self-aligned with each other. The process for forming a self-aligned gate electrode and channel region also results in a tightly controlled amount of overlap of the gate electrode and the source/drain regions of each transistor. The process can be selected to provide transistors with symmetrical overlap of the gate electrode with the source/drain regions or with an asymmetrical overlap of the gate electrode with the source/drain regions.

Accordingly, embodiments of the present disclosure provide an integrated circuit with transistors having reduced amounts of induced charges in the overlap region of the gate electrode and the source/drain regions. Furthermore, the effective channel length can be carefully controlled, thereby providing high quality performance of the transistors. The result is higher performing transistors, fewer scrapped wafers, and overall improved wafer yields.

Figure 1A:
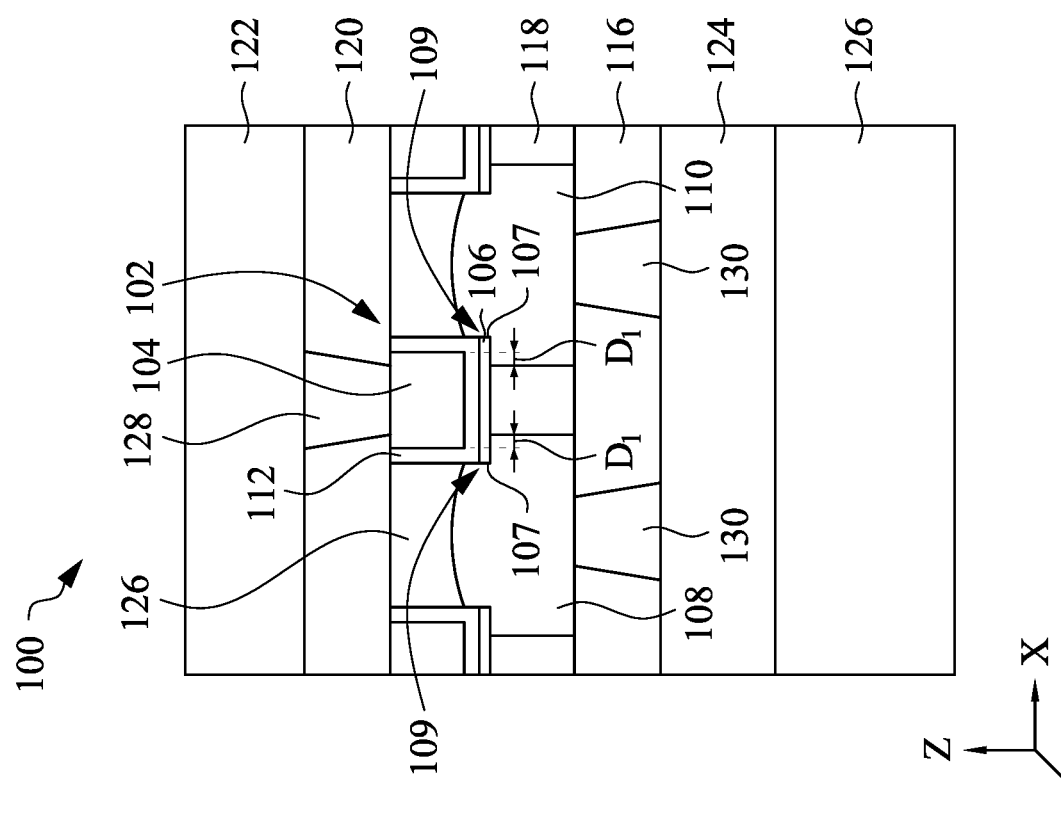
FIG. 1A is a cross-sectional view of an integrated circuit including a 2D transistor, in accordance with some embodiments.

FIG. 1A is a cross-sectional view of an integrated circuit, in accordance with some embodiments. The integrated circuit incudes a transistor 102. The transistor 102 may include a two-dimensional transistor. As will be set forth in more detail below, the transistor 102 utilizes self-aligned structures to achieve high performance.

The transistor 102 includes a gate metal 104. The gate metal 104 corresponds to a gate electrode, or may correspond to one of the metals that make up a gate electrode of the transistor 102. The gate metal 104 can include one or more of titanium nitride, tungsten, tantalum, tantalum nitride, ruthenium, cobalt, aluminum, titanium, tantalum aluminum nitride, or other suitable conductive materials. The gate metal 104 may have a thickness between 5 nm and 30 nm. Other materials and dimensions can be utilized for the gate metal 104 without departing from the scope of the present disclosure.

The transistor 102 includes a gate dielectric 112. The gate dielectric 112 is positioned on the bottom surface and on the sidewalls of the gate metal 104. In some embodiments, the gate dielectric 112 may include a high-K dielectric material. The high-K gate dielectric material may include HfO2, HfSiO, HfSiON, HfTaO, HfSiO, HfZrO, zirconium oxide, aluminum oxide, titanium oxide, hafnium dioxide-alumina (HfO2-Al2O3) alloy, other suitable high-k dielectric materials, and/or combinations thereof. The thickness of the high-k dielectric is in a range from about 1 nm to about 10 nm. Other thicknesses and materials can be utilized for the high-K dielectric material of the gate dielectric 112 without departing from the scope of the present disclosure.

In some embodiments, the gate dielectric includes a both a low-K gate dielectric layer and a high-K gate dielectric layer. The low-K gate dielectric layer is in contact with the channel region 104. The high-K gate dielectric layer is in contact with the low-K gate dielectric layer and the gate metal 104. The thickness of the low-K gate dielectric layer is between 0.5 nm and 2 nm. The low-K gate dielectric layer can include a dielectric material such as silicon oxide, silicon nitride, or other suitable dielectric materials. The low-K gate dielectric layer can include a comparatively low-K dielectric with respect to high-K dielectric materials such as hafnium oxide or other high-K dielectric materials that may be used in gate dielectrics of transistors. The low-K gate dielectric layer may be termed an interfacial gate dielectric layer.

The high-K gate dielectric layer may be substantially as described previously. The thickness of the high-k dielectric layer is in a range from about 1 nm to about 10 nm. Accordingly, the thickness of the gate dielectric 106 may be between 1.5 nm and 12 nm, in some embodiments in which both a low-K and a high-K gate dielectric are utilized. Other thicknesses, deposition processes, and materials can be utilized for the low-K and high-K gate dielectric layers without departing from the scope of the present disclosure.

The transistor 102 includes a channel region 106. The channel region 106 may correspond to a two dimensional channel region. The two dimensional channel region 106 may include a plurality of molecular or atomic monolayers. Each monolayer may be a single atom or molecule in thickness. In some cases, the channel region 106 may include between one and five monolayers and may have a thickness between 0.5 nm and 5 nm. The two dimensional channel region 106 may include WS2, WSe2, MoS2, MoSe2, MoTe2, HfS2, HfSe2, ZrS2, or other suitable materials. In some embodiments, the channel region 106 may include a plurality of carbon nanotubes laid out in a plane. The carbon nanotubes may have a diameter between 0.5 nm and 1.5 nm. The diameter of a single carbon nanotube may correspond to the thickness of the channel region 106. Other materials and dimensions can be utilized for the channel region 106 of the transistor 102 without departing from the scope of the present disclosure.

As used herein, "two dimensional channel region" or "2D channel region" may correspond to a transistor channel region made up of monolayers of a natural semiconductor material, such as those described above, or to a channel region made up of carbon nanotubes. As used herein, the term "two dimensional transistor" or "2D transistor" may correspond to a transistor that includes a 2D channel region as described above.

The transistor 102 includes a first source/drain region 108 and a second source/drain region 110. The source/drain regions 108 and 110 can each include a metal material. The source/drain regions 108 and 110 may include tungsten, cobalt, ruthenium, titanium nitride, titanium, tantalum nitride, tantalum, aluminum, molybdenum, silver, Sc, hafnium, Sn, Au, Pt, Pd, or combinations thereof. The source/drain regions 108 and 110 may include other materials without departing from the scope of the present disclosure. The source/drain regions 108 and 110 may have a thickness between 5 nm and 50 nm, though other thicknesses can be utilized without departing from the scope of the present disclosure.

The channel region 106 is in contact with the source/drain regions 108 and 110. The channel region 106 is self-aligned with the gate metal 104. More particularly, the channel region 106 is self-aligned with the gate dielectric 112. In other words, the sides of the channel region 106 are substantially coplanar with the sidewalls of the gate dielectric 112. The process for achieving the self-aligned results described in relation to FIGS. 2A-2O. Nevertheless, the self-alignment of the channel region 106 with the gate electrode 104 enables very little overlap of the gate metal 104 with the source/drain regions 108 and 110 in the X direction. The gate metal 104 laterally overlaps the first and second source/drain regions 108 and 110 with a dimension D1 in the X direction. The value of the dimension D1 is between 1 nm and 30 nm. This value may be small enough to ensure a sufficiently small gate to source/drain capacitance to ensure high-speed operability of the transistor 102, while also ensuring that the channel region 106 makes sufficient contact with the source/drain regions 108 and 110 in embodiments in which the the channel regions 106 and the gate metal 104 are self-aligned.

In FIG. 1A, the channel region 106 and the gate electrode 104 overlap the source/drain regions 108 and 110 in a symmetrical manner. In other words, the overlap of the channel 106 and the gate metal 104 with the first source/drain region 108 is substantially identical to the overlap of the channel region 106 and the gate metal 104 with the second source/drain region 110.

The relatively small overlap of the gate metal 104 with the source/drain regions 108 and 110 provides several benefits. One such benefit is that there are fewer induced charges in the portions of the channel region 106 the overlap the source/drain regions 108 and 110. Furthermore, the parasitic capacitance between the gate metal 104 and the source/drain regions 108 and 110 is relatively small. These factors can result in very high electrical performance of the transistor 102, including higher switching speeds and reduced leakage.

The integrated circuit 100 includes a dielectric layer 116. The source/drain regions 108 and 110 are positioned on the dielectric layer 116. The dielectric layer 116 can include silicon oxide, silicon nitride, silicon oxynitride, oxycarbonitride, carhonitride, fluorine-doped silicate glass (FSG), or a low-K dielectric material. Other materials can be utilized for the dielectric layer 116 without departing from the scope of the present disclosure.

The integrated circuit 100 includes conductive vias 130 positioned in the dielectric layer 106. The conductive vias 130 are in contact with the source/drain regions 108 and 110. The conductive vias 130 provide an electrical connection to the source/drain regions 108 and 110. The conductive vias 130 can include tungsten, cobalt, aluminum, titanium, copper, gold, titanium nitride, tantalum nitride, tantalum, combinations of these materials, or other suitable materials.

The integrated circuit 100 includes a dielectric layer 118 on the dielectric layer 116. The source/drain regions 108 and 110 are positioned in the dielectric layer 118. The source/drain regions 108 and 110 of a bottom surface that is substantially coplanar with the bottom surface of the dielectric layer 118. The channel region 106 is also in contact with the dielectric layer 118. The dielectric layer 118 can include silicon oxide, silicon nitride, silicon oxynitride, silicon oxycarhonitride, silicon carbonitride, fluorine-doped silicate glass (FSG), or a low-K dielectric material. Other mateiials can be utilized for the dielectric layer 118 without departing from the scope of the present disclosure.

The integrated circuit 100 includes a dielectric layer 126 positioned on the source/drain regions 108 and 110 and between the gate dielectric 112 of adjacent transistors. The dielectric layer 126 is a top surface that is substantially coplanar with the top surface of the dielectric layer 112 and the gate metal 104. The dielectric layer 126 can include silicon oxide, silicon nitride, silicon oxynitride, silico oxycarbonitride, silicon carbonitride, fluorine-doped silicate glass (FSG), or a low-K dielectric material. Other dielectric materials can be utilized for the dielectric layer 126 without departing from the scope of the present disclosure.

The integrated circuit 100 includes a dielectric layer 120 on the dielectric layer 126 and on the gate metal 104. The dielectric layer 120 can include silicon oxide, silicon nitride, oxynitride, silicon oxycarbonitride, silica carbonitride, fluorine-doped silicate glass (FSG), or a low-K dielectric material. Other materials can be utilized for the dielectric layer 120 without departing from the scope of the present disclosure.

The conductive via 128 is positioned in the dielectric layer 120. The conductive via 128 is in electrical contact with the gate metal 104. Electrical signals can be provided to the gate metal 104 through the conductive via 128. The conductive via 128 can include tungsten, cobalt, aluminum, titanium, copper, gold, titanium nitride, tantalum nitride, tantalum, combinations of these materials, or other suitable materials. Other materials can be utilized for the conductive via 128 without departing from the scope of the present disclosure.

The integrated circuit 100 includes a dielectric layer 122 on the dielectric layer 120. The dielectric layer 122 can include silicon oxide, silicon nitride, silicon oxynitride, silicon oxycarbonitride, silicon carbonitride, fluorine-doped silicate glass (FSG), or a low-K dielectric material. Other materials can be utilized for the dielectric layer 122 without departing from the scope of the present disclosure. Though not shown in FIG. 1A, metal lines or other types of metal interconnect structures can be formed in the dielectric layer 122. The metal lines or other metal interconnect structures can connect with the conductive via 128.

The integrated circuit 100 can also include a substrate 126. The substrate 126 can include a semiconductor material. The semiconductor material can include silicon, silicon germanium, gallium arsenide, or other suitable semiconductor materials. Other semiconductor materials can be utilized without departing from the scope of the present disclosure.

The integrated circuit 100 includes a dielectric layer 124 on the substrate 126. The dielectric layer 124 can include silicon oxide, silicon nitride, silicon oxynitride, silicon oxycarbonitride, silicon carbonitride, fluorine-doped silicate glass (FSG), or a low-K dielectric material. Other materials can be utilized for the dielectric layer 124 without departing from the scope of the present disclosure. Though not shown in FIG. 1A, metal lines or oilier types of metal interconnect structures can be formed in the dielectric layer 124. The metal lines or other metal interconnect structures can connect with the conductive vias 130.

In the integrated circuit 100, the conductive vias 130 and 128 are positioned on opposite sides of the transistor 102. In particular, the conductive vias 130 that connect to the source/drain regions 108 and 110 are positioned in the dielectric layer 116 below the source/drain regions 108 and 110. The conductive via 128 that connect to the gate metal 104 is positioned in the dielectric layer 120 above the gate metal 104 and above the source/drain regions 108 and 110. Furthermore, the conductive vias 130 are formed on an opposite side of the source/drain regions 108 and 110 with respect to the gate metal 104.

The channel region 106 incudes lateral ends 107. The lateral ends 107 are coplanar with lateral sidewalls of the gate dielectric 112.

The first and second source/drain regions each include a respective step structure 109. Each step structure includes a horizontal surface and a vertical surface. The channel regions 106 is positioned on the horizontal surface of each step structure. The lateral ends 107 of the channel region 106 each abut the vertical surface of a respective step structure. The lateral sidewalls of the gate dielectric 112 each abut the vertical surface of the respective step structure.

The channel region 106 includes lateral ends 107.

The transistor 102 of FIG. 1A can include other structures, components, and dimensions than those shown and described in relation to FIG. 1A without departing from the scope of the present disclosure.

FIG. 1B is a cross-sectional view of an integrated circuit 100 including a transistor 102 in accordance with some embodiments. The integrated circuit 100 of FIG. 1B is substantially similar to the integrated circuit 100 of FIG. 1A. One difference between the views of FIG. 1A and FIG. 1B is that the gate metal 104 and the channel region 106 overlap the source/drain regions 108 and 110 in an asymmetrical manner in FIG. 1B. In particular, the channel region 106 overlaps the first source/drain region 108 with a dimension D2 in the X direction between 1 nm and 30 nm. The channel region 106 overlaps the second source/drain region 110 with a dimension D3 in the X direction between 0 nm and 25 nm.

In some embodiments, the first source/drain region 108 is a source region and the second source/drain region 110 is a drain region. One benefit of having the reduced overlap length of the drain side with respect to the source side is that there is a reduction in the gate and drain capacitance of the transistor 102. The gate and drain capacitance can be particularly harmful to the performance of the transistor 102. Accordingly, it may be highly beneficial to provide a particularly small overlap of the gate metal 104 with the drain region. In some cases, it may be beneficial to have a smaller overlap D2 of the source region than of the overlap D3 of the drain region 110.

Figure 2B:
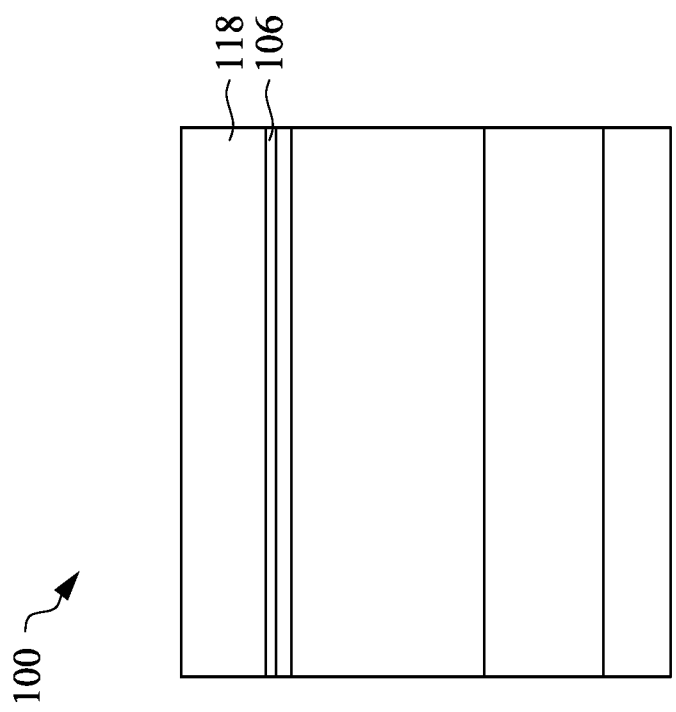
FIGS. 2A-2O are cross-sectional views of an integrated circuit at various stages of processing, in accordance with some embodiments.
Figure 2A:
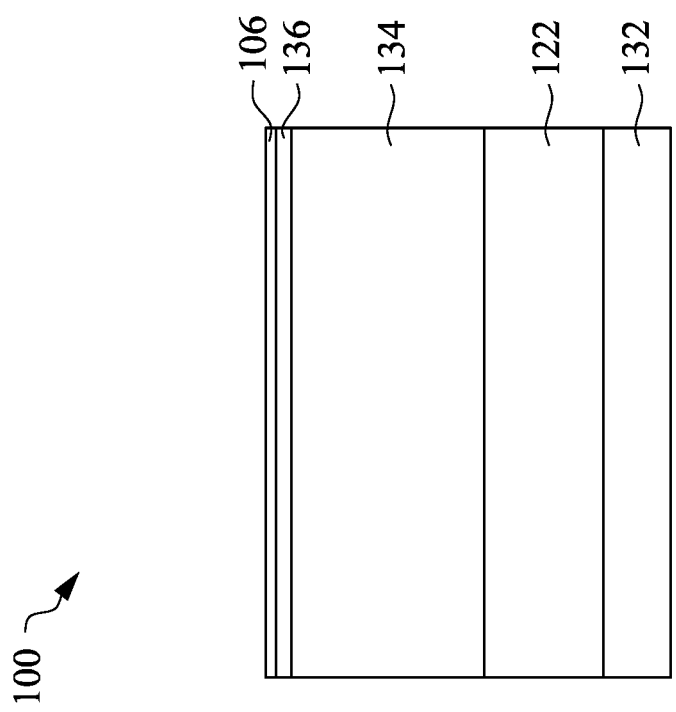
Figure 2D:
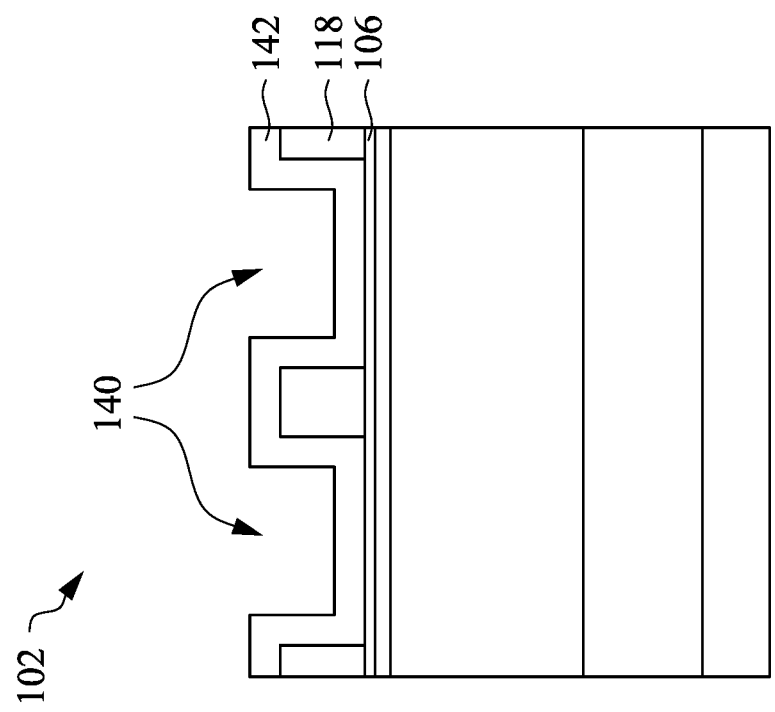
Figure 2C:
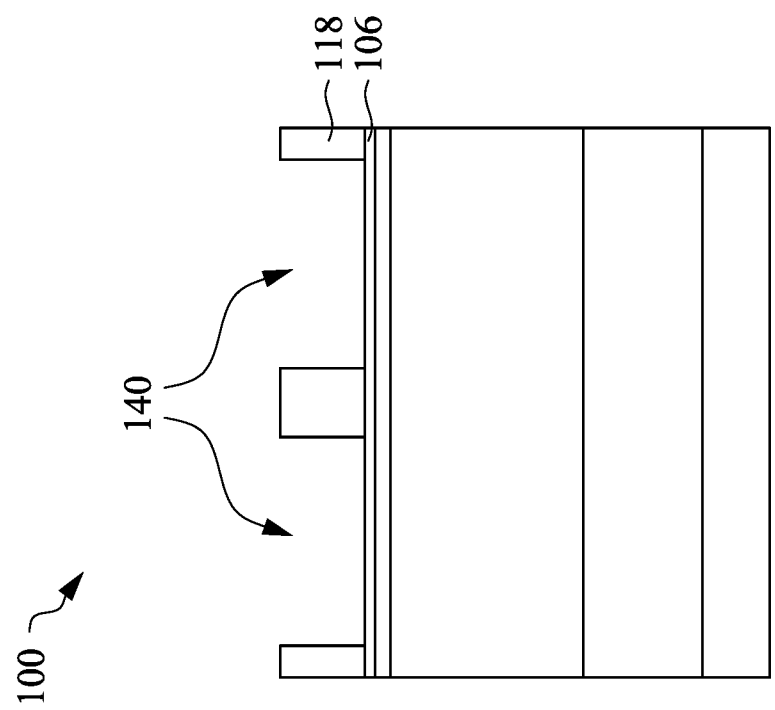
Figure 2E:
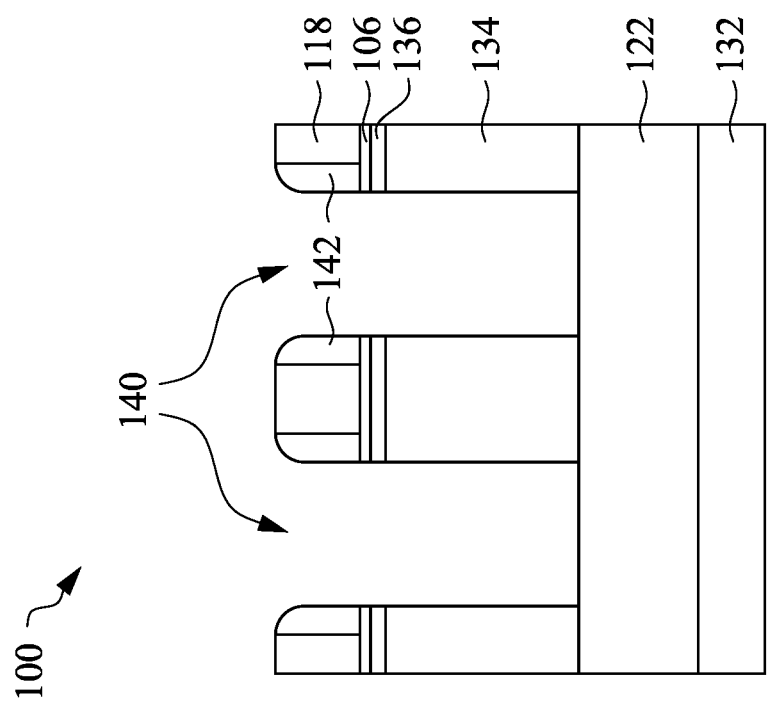
Figure 2G:
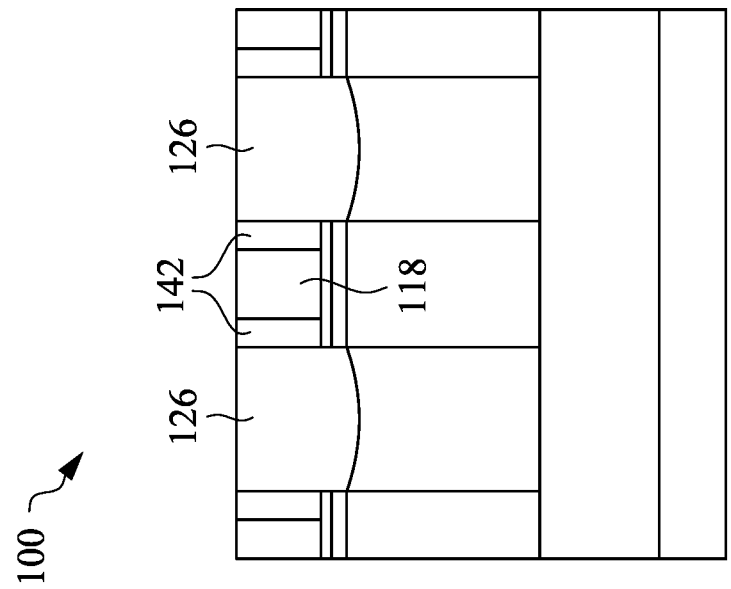
Figure 2F:
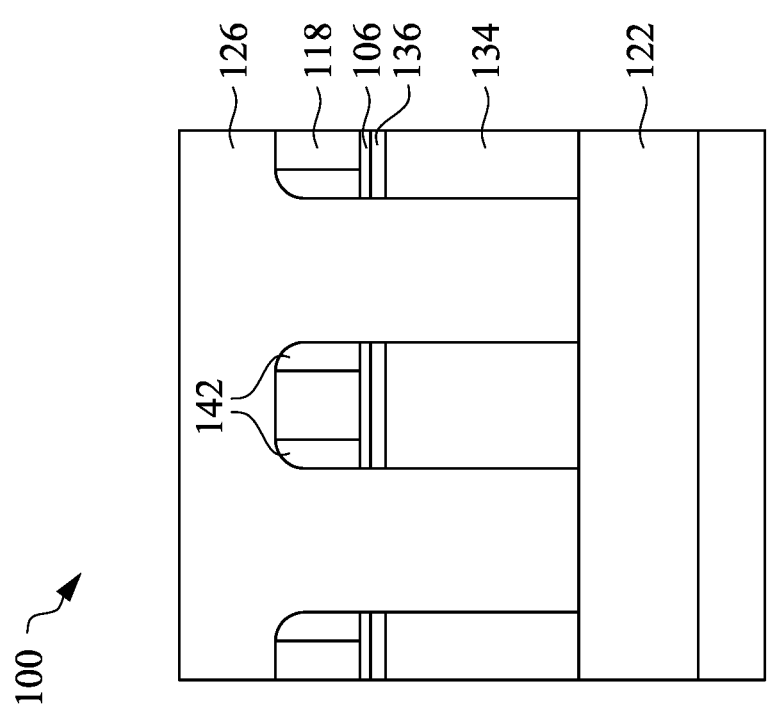
Figure 2I:
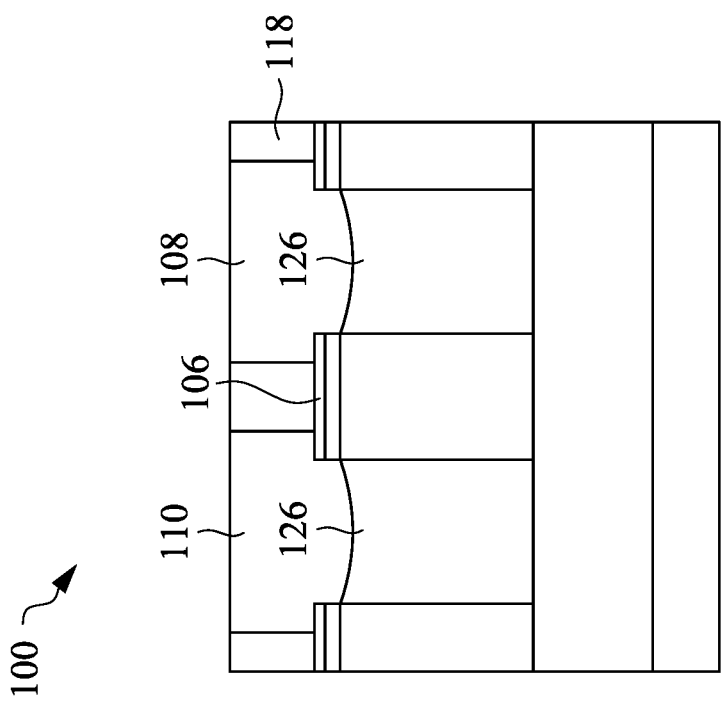
Figure 2H:
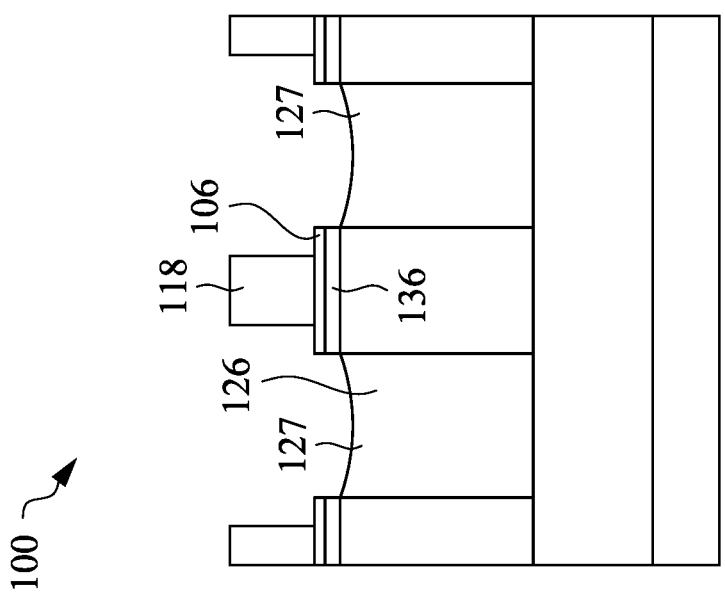
Figure 2K:
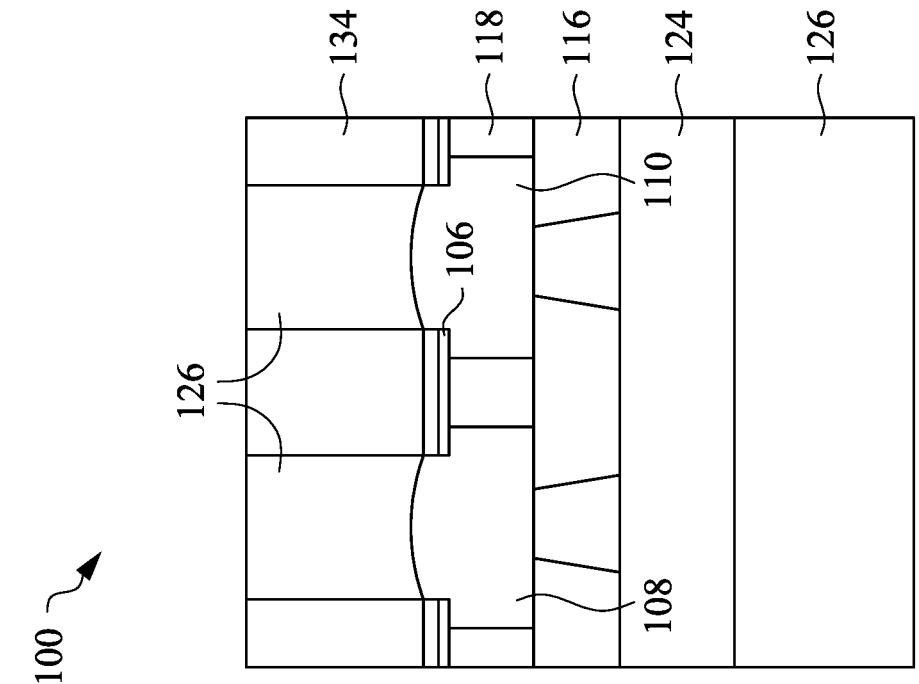
Figure 2J:
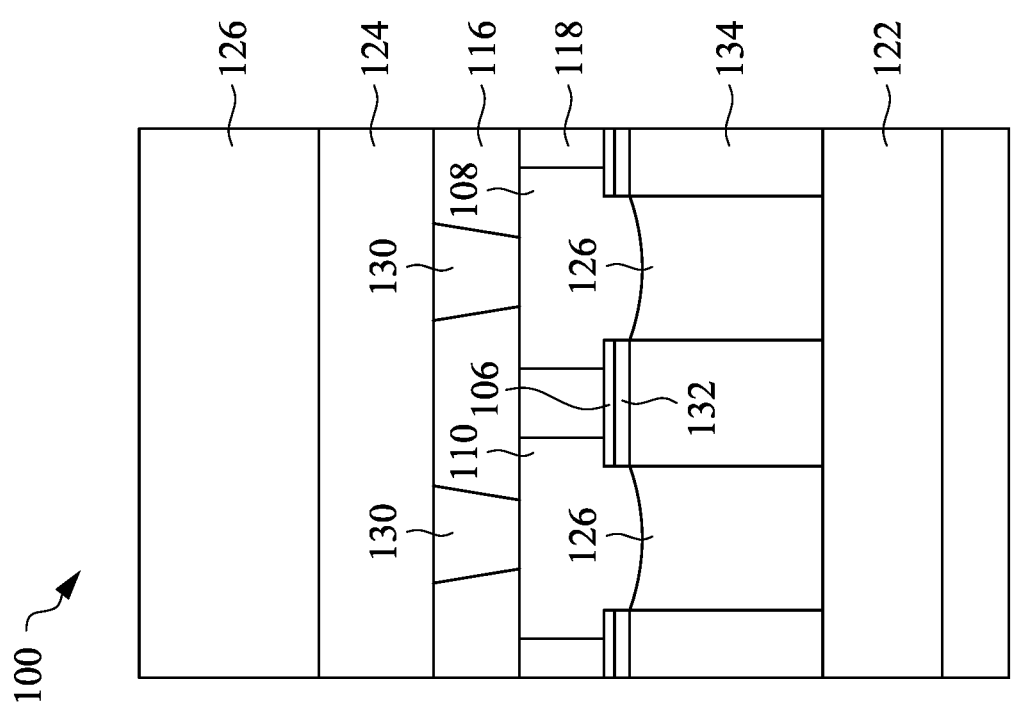
Figure 2M:
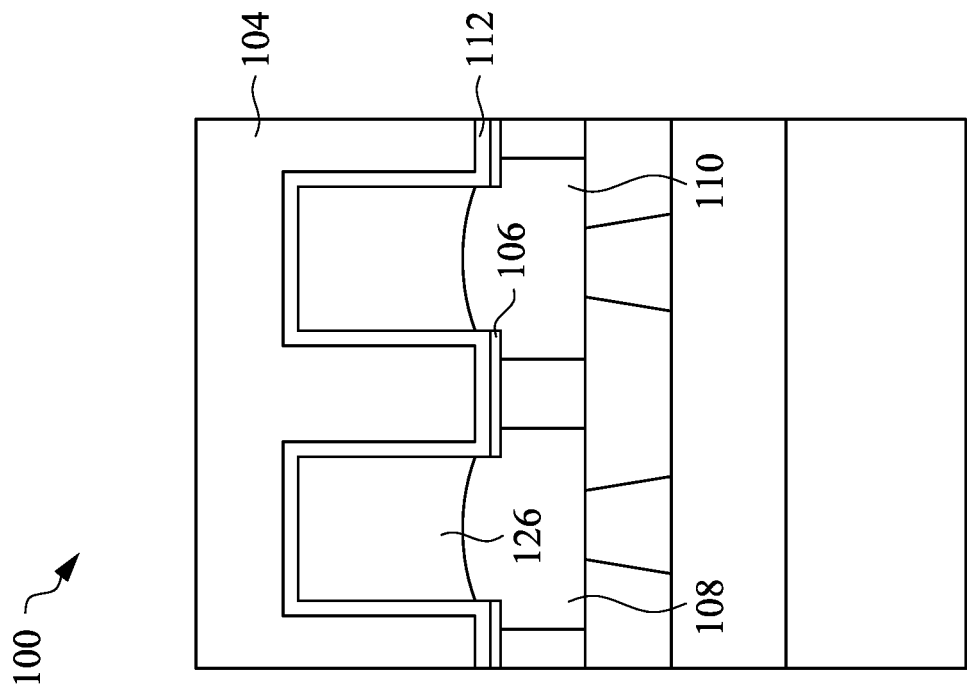
Figure 2L:
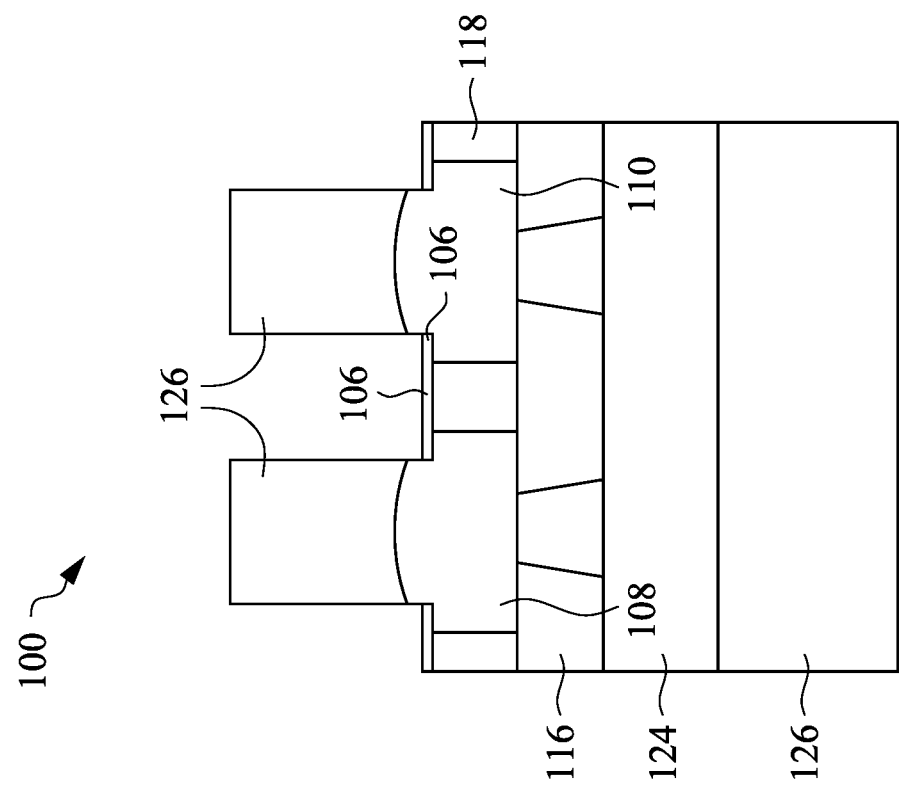
Figure 2O:
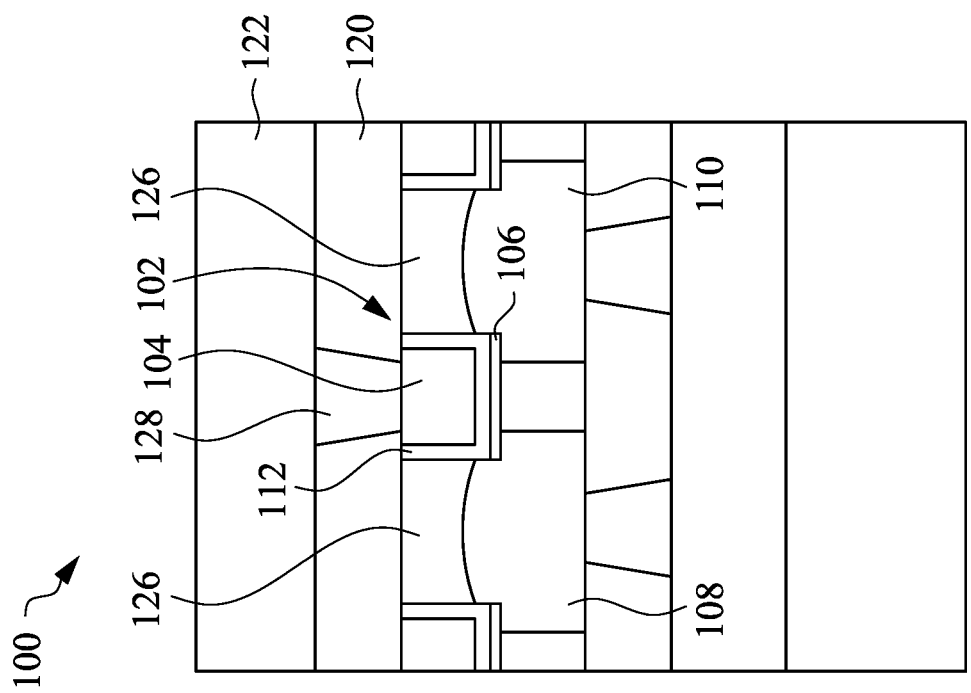

FIGS. 2A-2O are cross-sectional views of an integrated circuit 100 at various stages of processing, in accordance with some embodiments. The process shown in relation to FIGS. 2A-2O may result in the integrated circuit 100 of FIG. 1A.

In FIG. 2A, the integrated circuit includes a substrate 132. The substrate 132 may include a semiconductor material. The semiconductor material may include silicon, silicon germanium, gallium arsenide, or other semiconductor materials.

The dielectric layer 122 is positioned on the substrate 132. The dielectric layer 122 can include silicon oxide, silicon nitride, silicon oxynitride, silicon oxycarbonitride, silicon carbonitride, fluorine-doped silicate glass (FSG), or a low-K dielectric material. The dielectric layer 122 may have a thickness between 10 nm and 100 nm. Other materials and thicknesses can be utilized for the dielectric layer 122 without departing from the scope of the present disclosure.

The integrated circuit 100 includes a layer of polysilicon 134 positioned on the dielectric layer 122. The layer of polysilicon 134 can have a thickness between 10 nm and 80 nm. The layer of polysilicon 134 can have other thicknesses without departing from the scope of the present disclosure. Alternatively, other materials can be utilized in place of the layer polysilicon 134 without departing from the scope of the present disclosure.

A dielectric layer 136 is positioned on the layer polysilicon 134. The dielectric layer 136 can have a thickness between 1 nm and 10 nm. The dielectric layer 136 can include silicon oxide, silicon nitride, silicon oxyintride, silicon oxycarbonitride, carbonitride, fluorine-doped silicate glass (FSG), or a low-K dielectric material. The dielectric layer 136 can include other materials and thicknesses without departing from the scope of the present disclosure.

A channel region 106 has been deposited on the dielectric layer 136. As will be set forth in more detail below, the channel region 106 will eventually be patterned to form the individual channel regions of individual transistors. The channel region 106 may correspond to a two dimensional channel region. The two dimensional channel region 106 may include a plurality of molecular or atomic monolayers. Each monolayer may be a single atom or molecule in thickness. In some cases, the channel region 106 may include between one and five monolayers and may have a thickness between 0.5 nm and 5 nm. The two dimensional channel region 106 may include WS2, WSe2, MoS2, MoSe2, MoTe2, HfS2, HfSe2, ZrS2, or other suitable materials. In some embodiments, the channel region 106 may include a plurality of carbon nanotubes laid out in a plane. The carbon nanotubes may have a diameter between 0.5 nm and 1.5 nm. The diameter of a single carbon nanotube may correspond to the thickness of the channel region 106. The channel region 106 may be deposited by atomic layer deposition (ALD) chemical vapor deposition (CVD), physical vapor deposition (PVD) or other suitable deposition processes. Other materials, dimensions, and deposition processes can be utilized for the channel region 106 without departing from the scope of the present disclosure.

In FIG. 2B, a dielectric layer 118 has been deposited on the channel region 106. The dielectric layer 118 can include silicon oxide, silicon nitride, silicon oxynitride, silico oxycarbonitride, silicon carbonitride, fluorine-doped silicate glass (FSG), or a low-K dielectric material. The dielectric layer 118 can be deposited by CVD, ALD, PVD or other suitable dielectric processes. The dielectric layer 118 can have a thickness between 10 nm and 15 nm. Other materials, deposition processes, and thicknesses can be utilized for the dielectric layer 118 without departing from the scope of the present disclosure.

In FIG. 2C, trenches 140 have been formed in the dielectric layer 118. The trenches 140 can be formed in conjunction with a photolithography process. The photolithography process can include depositing a layer of photoresist on the integrated circuit 100 and patterning the layer of photoresist by exposure to radiation via a photolithography reticle. This process leaves the pattern of the trenches 140 in the layer of photoresist. After patterning the photoresist, the trenches 140 can be formed by etching the exposed portions of the dielectric layer 118.

In FIG. 2D, the dummy spacer layer 142 has been deposited on the remaining portions of the dielectric layer 118 and on the exposed portions of the channel region 106. The dummy spacer layer 142 can include silicon oxide, silicon nitride, silicon oxynitride, silicon oxycarbonitride, silico carbonitride, fluorine-doped silicate glass (FSG), or a low-K dielectric material. The dielectric layer 142 can be deposited by CVD, ALD, PVD or other suitable dielectric processes. The dummy spacer layer 142 can have a thickness between 1 nm and 30 nm. Other materials, processes, and thicknesses can be utilized for the dummy spacer layer 142.

In FIG. 2E, an anisotropic etching process has been performed. The anisotropic etching process etches selectively in the downward direction. The anisotropic etching process removes the dummy spacer layer 142 from the top surfaces of the dielectric layer 118 and from the channel region 106. The anisotropic etching process etches through the channel region 106, the dielectric layer 136, and the polysilicon layer 134. The anisotropic etching process exposes the dielectric layer 122. The anisotropic etching process can include a dry etching process or other types of etching processes. The anisotropic etching process can include multiple etching steps or single etching step.

In FIG. 2F, a dielectric layer 126 has been deposited on the integrated circuit 100. The dielectric layer 126 fills the trenches 140 and covers the remaining portions of the dummy spacer layer 142 and the dielectric layer 118. The dielectric layer 126 can include silicon oxide, silicon nitride, silicon oxynitride, silicon oxycarbonitride, silicon carbonitride, fluorine-doped silicate glass (FSG), or a low-K dielectric material. The dielectric layer 126 can be deposited by CVD. ALD, PVD or other suitable dielectric processes. The dielectric layer 126 can be deposited to have a thickness between 1 nm and 20 nm above the top surfaces of the dielectric layer 118 and the dummy spacer layer 142. The material of the dielectric layer 126 may be selected to be different from and selectively etchable with respect to the dielectric layer 118. Other materials, thicknesses, and deposition processes can be utilized for the dielectric layer 126 without departing from the scope of the present disclosure.

In FIG. 2G, a chemical mechanical planarization process (CMP) has been performed. The CMP process removes the upper portions of the dielectric layer 126, the dielectric layer 118, and the dummy spacer layer 142. The CMP process also planarized is the top surfaces of the dielectric layer 126, the dielectric layer 118, and the dummy spacer layer 142.

In FIG. 2H, an etching processes been performed. The etching process selectively etches the materials of the spacer layer 142 and the dielectric layer 126 with respect to the dielectric layer 118. The dielectric layer 126 is recessed below the level of the channel region 106. The recessing process resulted a curve top surface 127 of the dielectric layer 126. This can be accomplished by use of an isotropic etching process for etching the dielectric layer 126. The top surface 127 of the dielectric layer 126 is recessed to a depth of between 1 nm and 10 nm below the channel region 106. The etching process can be a timed etching process.

In FIG. 2I, source/drain regions 108 and 110 have been formed. The source/drain regions 108 and 110 can each include a metal material. The source/drain regions 108 and 110 may include tungsten, cobalt, ruthenium, titanium nitride, titanium, tantalum nitride, tantalum, aluminum, molybdenum, silver, Sc, hafnium, Sn, Au, Pt, Pd, or combinations thereof. The source/drain regions 108 and 110 may be formed by depositing the metal material on the dielectric layer 126 and on the channel region 106 between the remaining portions of the dielectric layer 118. The metal material may be formed by PVD, ALD, or CVD. After deposition of the materials for the source/drain regions 108 and 110, a CMP process is performed to planarize the top surfaces of the source/drain regions 108 and 110 with the remaining portions of the dielectric layer 118. The source/drain regions 108 and 110 may include other materials and deposition processes without departing from the scope of the present disclosure. In some embodiments, the source/drain region 108 is a source region and the source/drain region 110 is a drain region.

In FIG. 2J, a dielectric layer 116 has been deposited on the dielectric layer 118 and on the source/drain regions 108 and 110. The dielectric layer 116 can include silicon oxide, silicon nitride, silicon oxynitride, silico oxycarbonitride, silicon carbonitride, fluorine-doped silicate glass (FSG), or a low-K dielectric material. The dielectric layer 116 can be deposited by CVD, ALD, PVD or other suitable dielectric processes. Other materials, thicknesses, and deposition processes can be utilized for the dielectric layer 116 without departing from the scope of the present disclosure.

In FIG. 2J, conductive vias 130 have been formed through the dielectric layer 116. The conductive vias 130 are in contact with the source/drain regions 108 and 110. The conductive vias 130 can be formed in conjunction with a photolithography process that forms trenches in the dielectric layer 116. The material of the conductive vias 130 is then deposited in the trenches in the dielectric layer 113 contacting the source/drain regions 108 and 110. The conductive vias 130 can include tungsten, cobalt, aluminum, titanium, copper, gold, titanium nitride, tantalum nitride, tantalum, combinations of these materials, or other suitable materials. The material of the conductive vias 130 can be deposited by PVD, ALD, or CVD. A CMP process can then be performed to planarize the top surfaces of the conductive vias 130 with the top surface of the dielectric layer 116. Other processes and materials can be utilized for the conductive vias 130 without departing from the scope of the present disclosure.

In FIG. 2J, a dielectric layer 124 has been deposited on the dielectric layer 116 and on the conductive vias 130. The dielectric layer 124 can include silicon oxide, silicon nitride, silicon oxynitride, silicon oxycarbonitride, silicon carbonitride, fluorine-doped silicate glass (FSG), or a low-K dielectric material. The dielectric layer 124 can be deposited by CVD, ALD, PVD or other suitable dielectric processes. Other materials, thicknesses, and deposition processes can be utilized for the dielectric layer 124 without departing from the scope of the present disclosure.

Though not shown in FIG. 2J, the metal interconnect structures can be formed in the dielectric layer 124. In particular, utilizing photolithography processes, trenches can be etched in the dielectric layer 124 in a desired pattern for metal interconnect structures. The metal interconnect structures can include metal lines or other types of metal interconnect structures. After forming the trenches, one or more metals may be deposited in the trenches in the dielectric layer 124. A CMP process may then be performed to planarize the top surfaces of the metal interconnect structures and the dielectric layer 124.

In FIG. 2J, a carrier wafer 126 has been bonded to the dielectric layer 124. The carrier wafer 126 may include a semiconductor material. The semiconductor material can include silicon, silicon germanium, gallium arsenide, or other suitable semiconductor materials. The carrier wafer 126 may be bonded to the dielectric layer 124 by placing the carrier wafer 126 on the dielectric layer 124 and performing a thermal annealing process. Alternatively, other adhesives or other types of processes can be utilized to bond the carrier wafer 126 to the dielectric layer 124. As will be set forth in more detail below, the carrier wafer 126 is utilized to flipping the integrated circuit 100 for processing from the backside.

In FIG. 2K, the integrated circuit 100 has been flipped vertically. The carrier wafer 126 is now at the bottom. The dielectric layer 122 and the semiconductor layer 132 have been removed. Portions of the dielectric layer 126 and the polysilicon layer 134 are now exposed.

In FIG. 2L, the polysilicon layer 134 and the dielectric layer 132 have been removed. The polysilicon layer 134 is the dielectric layer 132 can be removed by an etching process. The etching process selectively etches the polysilicon layer 134 and the dielectric layer 132 with respect to the dielectric layer 126, the source/drain regions 108 and 110, and the channel region 106. The etching process can include a wet etch, a dry etch, or other types of etching processes. The result is that the channel region 106, the dielectric layer 126, and portions of the source/drain regions 108 and 110 are exposed.

In FIG. 2M a gate dielectric 112 has been deposited. The gate dielectric 112 covers the channel region 106, the exposed portions of the source/drain regions 108 and 110, and the dielectric layer 126.

The gate dielectric 112 can include a single high-K gate dielectric layer. The high-K gate dielectric layer may include HfO2, HfSiO, HfSiON, HfTaO, HfTiO, HfZrO, zirconium oxide, aluminum oxide, titanium oxide, hafnium dioxide-alumina (HfO2-Al2O3) alloy, other suitable high-k dielectric materials, and/or combinations thereof. The high-K gate dielectric layer can be deposited by ALD, CVD, or PVD. The thickness of the high-k gate dielectric layer is in a range from about 1 nm to about 10 nm. Other thicknesses, deposition processes, and materials can be utilized for the high-K dielectric material of the gate dielectric 112 without departing from the scope of the present disclosure.

In some embodiments, the gate dielectric 112 includes a both a low-K gate dielectric layer and a high-K gate dielectric layer. The low-K gate dielectric layer is in contact with the channel region 106. The thickness of the low-K gate dielectric layer is between 0.5 nm and 2 nm. The low-K gate dielectric layer can include a dielectric material such as silicon oxide, silicon nitride, or other suitable dielectric materials. The low-K gate dielectric layer can be deposited by CVD, ALD, or PVD. The low-K gate dielectric layer may be termed an interfacial gate dielectric layer. Other materials, thicknesses, and deposition processes can be utilized for the low-K gate dielectric layer without departing from the scope of the present disclosure. After forming the low-K gate dielectric layer, the high-K gate dielectric layer is formed on the low-K gate dielectric layer.

In FIG. 2M, the gate metal 104 has been deposited. The gate metal 104 is deposited on the gate dielectric 112. Accordingly, the gate dielectric 112 separates the gate metal 104 from the channel region 106 and source/drain regions 108 and 110. The gate metal 104 and the channel region 106 are self-aligned with each other due to the etching process that defines the channel region 106 and forms the trenches in which the dielectric layer 126 is deposited prior to flipping the integrated circuit 100. This process also results in a symmetrical overlap of the gate metal 104 and the channel region 106 with the source/drain regions 108 and 110. This process enables tight control of the overlap of the gate metal 104 and the channel region 106 with the source/drain regions 108 and 110.

The gate metal 104 corresponds to a gate electrode. The gate metal 104 can include one or more of titanium nitride, tungsten, tantalum, tantalum nitride, ruthenium, cobalt, aluminum, titanium, tantalum aluminum nitride, or other suitable conductive materials. The gate metal 104 may have a thickness between 5 nm and 30 nm. The gate metal 104 can be deposited by ALD, PVD, or CVD. Other materials, deposition processes, and dimensions can be utilized for the gate metal 104 without departing from the scope of the present disclosure.

Figure 2N:
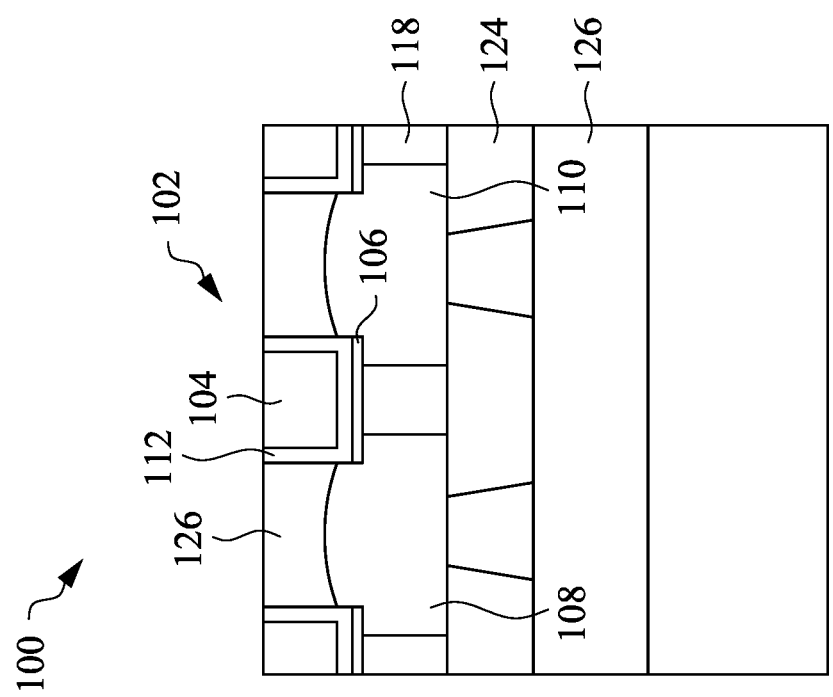

In FIG. 2N, a CMP process has been performed. The CMP process reduces the thickness of the gate metal 104 and the dielectric layer 126. The CMP process results in the formation of the individual gate electrodes from the gate metal 104 that are electrically isolated from each other. The CMP process results in the gate metal 104 having a top surface of the scope layer with the dielectric layer 126.

In FIG. 2N, a transistor 102 has been formed. The transistor 102 includes the gate metal 104, a gate dielectric 112, the channel region 106, a source/drain 108 and a source/drain region 110. The transistor 102 can have other components, materials, and structures without departing from the scope of the present disclosure.

In FIG. 2O, a dielectric layer 120 has been deposited over the gate metal 104 and the dielectric layer 126. The dielectric layer 120 can include silicon oxide, silicon nitride, silicon oxynitride, silicon oxycarbonitride, carbonitride, fluorine-doped silicate glass (FSG), or a low-K dielectric material. The dielectric layer 120 can be deposited by CVD, ALD, PVD or other suitable dielectric processes. Other materials and deposition processes can be utilized for the dielectric layer 120 without departing from the scope of the present disclosure.

In FIG. 2O, a conductive via 128 has been formed through the dielectric layer 120. The conductive via 128 is in contact with the gate metal 104. The conductive via 128 can be formed in conjunction with a photolithography process that forms trenches in the dielectric layer 120. The material of the conductive via 120 is then deposited in the trenches in the dielectric layer 120 contacting the gate metal 104. The conductive via 128 can include tungsten, cobalt, aluminum, titanium, copper, gold, titanium nitride, tantalum nitride, tantalum, combinations of these materials, or other suitable materials. The material of the conductive via 128 can be deposited by PVD, ALD, or CVD. A CMP process can then be performed to planarize the top surfaces of the conductive via 128 with the top surface of the dielectric layer 120. Other processes and materials can be utilized for the conductive via 128 without departing from the scope of the present disclosure.

In FIG. 2O, a dielectric layer 122 has been deposited on the dielectric layer 120 and on the conductive via 128. The dielectric layer 122 can include silicon oxide, silicon nitride, silicon oxynitride, silicon oxycarbonitride, silicon carbonitride, fluorine-doped silicate glass (FSG), or a low-K dielectric material. The dielectric layer 122 can be deposited by CVD, ALD, PVD or other suitable dielectric processes. Other materials and deposition processes can be utilized for the dielectric layer 122 without departing from the scope of the present disclosure.

Though not shown in FIG. 2O, the metal interconnect structures can be formed in the dielectric layer 122. In particular, utilizing photolithography processes, trenches can be etched in the dielectric layer 122 in a desired pattern for metal interconnect structures. The metal interconnect structures can include metal lines or other types of metal interconnect structures. After forming the trenches, one or more metals may be deposited in the trenches in the dielectric layer 122. A CMP process may then be performed to planarize the top surfaces of the metal interconnect structures and the dielectric layer 122.

After the processes described in relation to FIG. 2O, the integrated circuit 100 is at the stage of processing shown in FIG. 1A. A plurality of individual transistors have been formed. Each transistor includes a channel region 106 and a gate metal 104 that are self-aligned with each other and that have asymmetrical overlap with the source/drain regions 108 and 110. The integrated circuit 100 can include other structures and processes without departing from the scope of the present disclosure.

FIGS. 3A-3F are cross-sectional views of an integrated circuit 100 at various stages of processing, in accordance with some embodiments. The process shown in relation to FIGS. 3A-3F may result in the integrated circuit 100 of FIG. 1B.

Figure 3B:
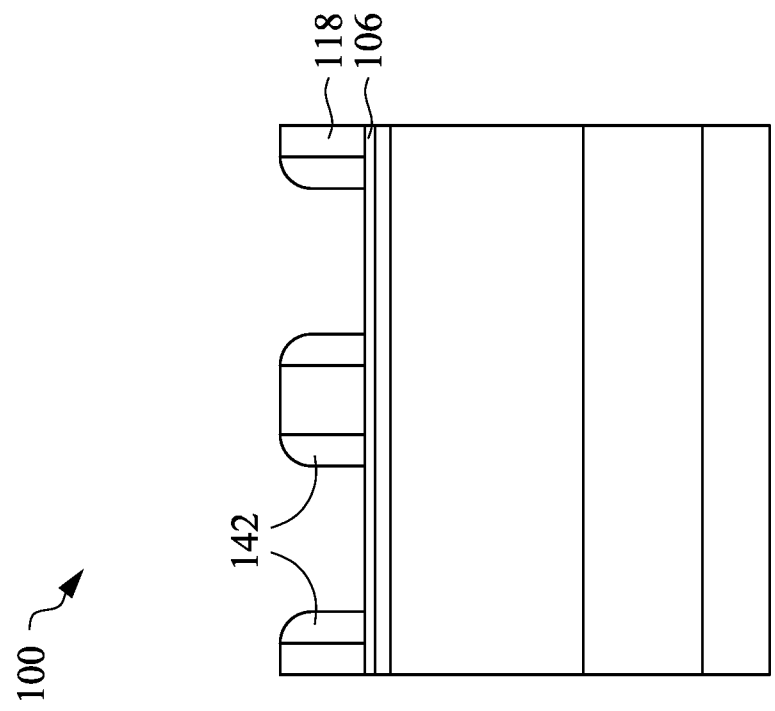
FIGS. 3A-3F are cross-sectional views of an integrated circuit at various stages of processing, in accordance with some embodiments.
Figure 3A:
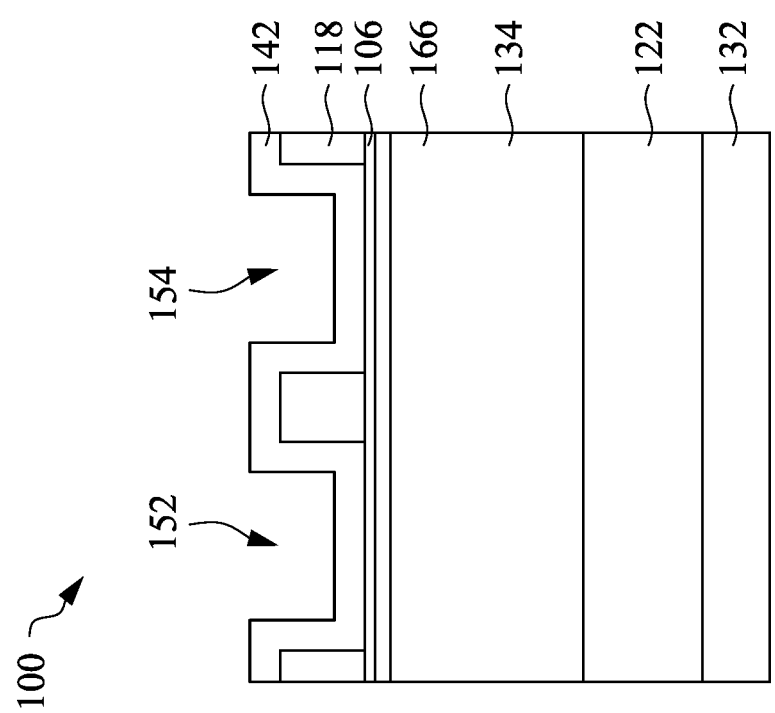

In FIG. 3A, the integrated circuit is that a substantially similar stage of processing as shown in FIG. 2D. In particular, the dummy spacer layer 142 has been formed on the dielectric layer 118 and the channel region 106. The dummy spacer layer 142 can be formed at the same processes and materials as described in relation to FIG. 2D. In FIG. 3A, a trench 152 is on the left and a trench 154 is on the right. As will be set forth in more detail below, the trench 154 will be utilized for defining the source/drain region 108 of the transistor 102. The trench 152 on the left will be utilized performing the source/drain region 110 of the transistor 102.

In FIG. 3B, and etching processes been performed. The etching process is an anisotropic etching process that etches in the downward direction. The anisotropic etching process removes the dummy spacer layer 142 from the top surfaces of the dielectric layer 118 and the channel region 106. The dummy spacer layer 142 remains on the sidewalls of the dielectric layer 118 where the initial vertical thickness of the dummy spacer layer 142 was greatest. In FIG. 3A, a mask 150 has been formed on the integrated circuit 100. The mask 150 can include a photoresist material that has been patterned using a photolithography process. The patterning process results in the mask 150 covering the portions of the dummy spacer layer 142 in the trench 154 on the right side. The trench 152 on the left side is exposed. When the trenches in FIG. 2D are labeled 140, the trenches in FIG. 3A are labeled 152 and 154 due to asymmetries that will be introduced as will be set forth in more detail below.

In FIG. 3B, an etching process has been performed in the presence of the mask 150. The etching process etches the exposed portions of the dummy spacer layer 142. The etching process can include a wet etch, a dry etch, or other etching processes. The etching process reduces the lateral width of the exposed portions of the dummy spacer layer 142. The duration of the etching process is selected to ensure that some amount of the dummy spacer layer 142 remains on the sidewalls of the dielectric layer 118 in the left trench 152. Because the portions of the dummy spacer layer 142 in the right trench 154 are covered by the mask 150, those portions of the dummy spacer layer 142 are not etched by the etching process.

After the etching process, the portions of the dummy spacer layer 142 in the trench 152 have a lateral dimension D3, while the portions of the dummy spacer layer 142 in the trench 154 have a lateral dimension D2. The lateral dimension D2 is greater than the lateral dimension D3. The lateral dimension D2 is between 5 nm and 30 nm. The lateral dimension D3 is between 0 nm and 25 nm. Accordingly, the etching process reduces the width of the exposed portions of the dummy spacer layer 142 by about 5 nm. Other dimensions and processes can be utilized to pattern the dummy spacer layer 142 in an asymmetrical manner without departing from the scope of the present closure. The trench 152 is wider than the trench 154 by about 10 nm, though other differences in which can be utilized without departing from the scope of the present disclosure.

Figure 3D:
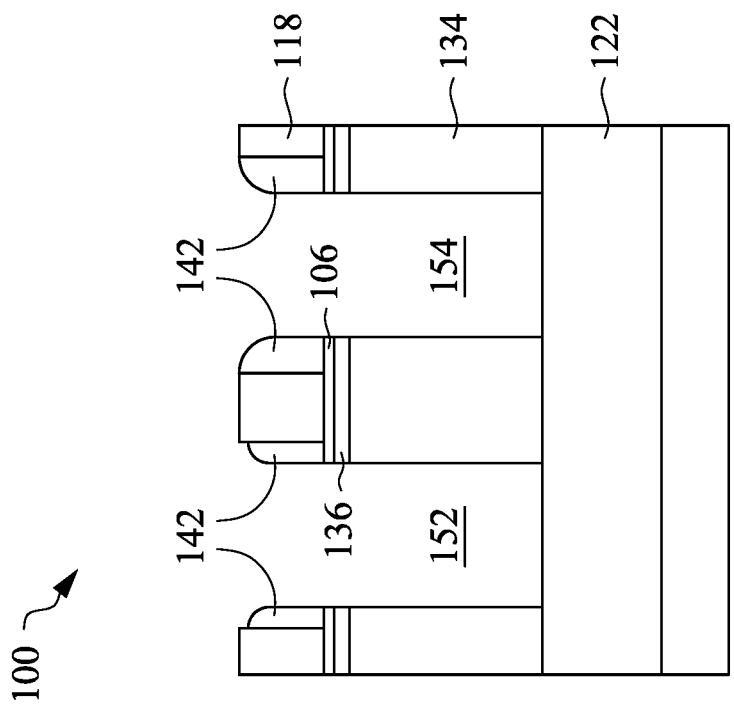
Figure 3C:
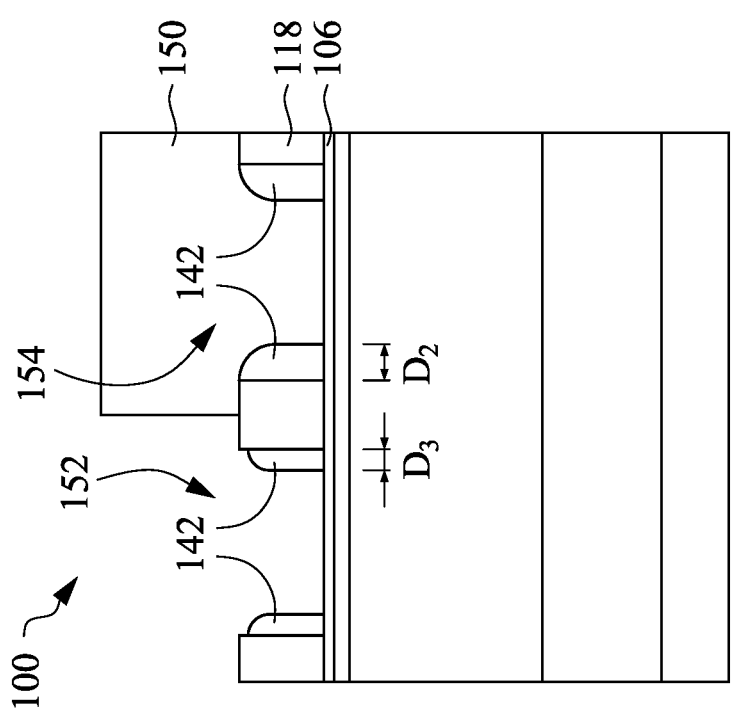

In FIG. 3D, an etching process has been performed to extend the trenches 152 through the channel region 106, the dielectric layer 136, and the polysilicon layer 134. This process can be substantially as described in relation to FIG. 2E, aside from the fact that patterning of the dummy spacer layer 142 has already occurred. The asymmetries in the trenches 152 and 154 are carried over into FIG. 3D because the remaining asymmetrical portions of the dummy spacer layer 142 are utilized as a mask for extending the depth of the trenches 152 and 154.

Figure 3F:
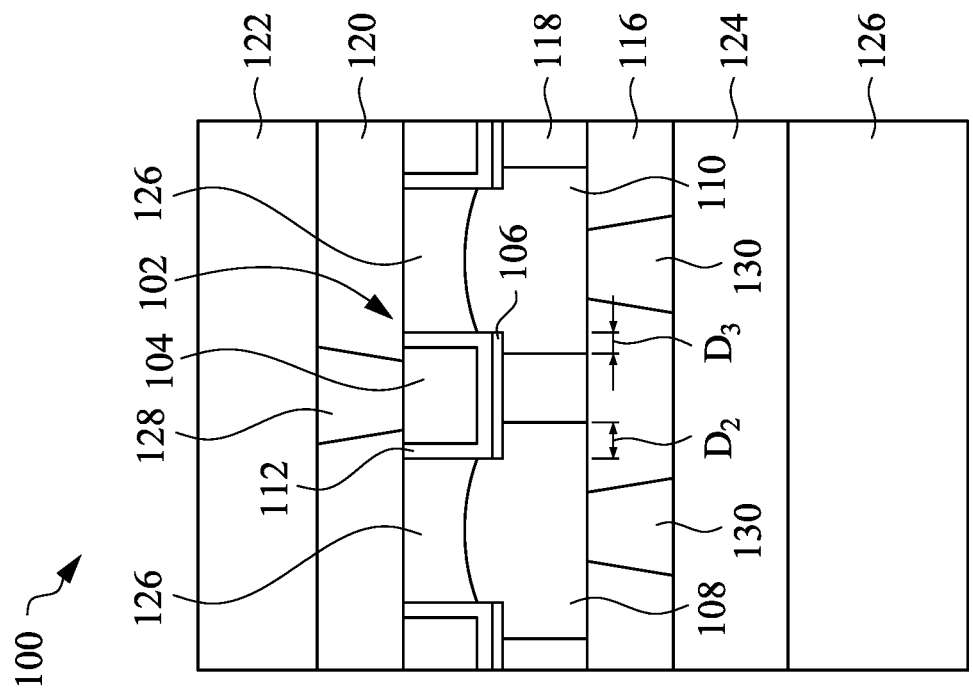
Figure 3E:
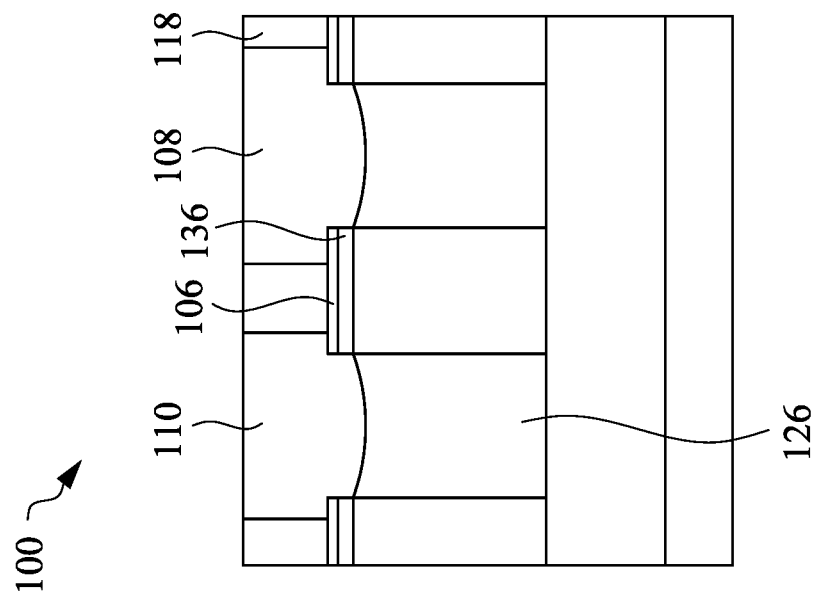

In FIG. 3E, the dielectric layer 126 and source/drain regions 108 and 110 have been formed. This can be accomplished using substantially the same process described in relation to FIGS. 2F-2I, aside from the asymmetries that have been introduced in FIGS. 3C and 3D.

In FIG. 3F, processing of the integrated circuit 100 has been completed. The process shown and described in relation to FIGS. 2J-2O can be utilized to produce the structure shown in FIG. 3F. However, the structure of the integrated circuit 100 of FIG. 3F is different than in FIG. 2O. This is due to the asymmetries that were introduced in FIGS. 3C and 3D. In particular, the overlap of the channel region 106 and the gate metal 104 relative to the source/drain regions 108 and 110 is asymmetrical. The asymmetry matches the asymmetry of the dummy spacer layer 142 introduced in FIG. 3C. In particular, there is a greater overlap of the channel region 106 and the gate metal 104 with the source/drain region 108 than with the source/drain region 110. The overlap of the channel region 106 with the source/drain region 108 is the dimension D2. The overlap of the channel region 106 with the source/drain region 110 is the dimension D2.

The overlap of the gate metal 104 with the source/drain region 108 is less than D3 by the amount of the lateral width of the vertical portions of the gate dielectric 112. The overlap of the gate metal 104 with the source/drain region 110 is less than the dimension D3 by the amount of the lateral width of the vertical portions of the gate dielectric 112.

In one embodiment, the source/drain region 108 is a source region and the source/drain region 110 is a drain region. As set forth previously, it may be beneficial to have a smaller overlap of the gate metal 104 with the drain region in order to reduce the capacitance between the gate metal 104 and the drain region. The gate to drain capacitance may be more harmful to the performance of the transistor 102 than is the gate to source capacitance. Accordingly, the self-aligned process combined with the asymmetries introduced by the patterning of the dummy spacer layer 142 allow for tight control of asymmetrical overlapping of the gate metal 104 with the source/drain regions 108 and 110. The overlap of the gate metal 104 with the drain region is between 0 nm and 25 nm. The overlap of the gate metal 104 with the source region is between 1 nm and 30 nm. These value may be small enough to ensure a sufficiently small gate to source/drain capacitances to ensure high-speed operability of the transistor 102, while also ensuring that the channel region 106 makes sufficient contact with the source/drain regions 108 and 110 in embodiments in which the channel regions 106 and the gate metal 104 are self-aligned.

The integrated circuit 100 in FIG. 3F corresponds to the integrated circuit 100 of FIG. 1B. Other processes and structures can be utilized for the integrated circuit 100 of FIGS. 1B and 3F without departing from the scope of the present disclosure.

Figure 4:
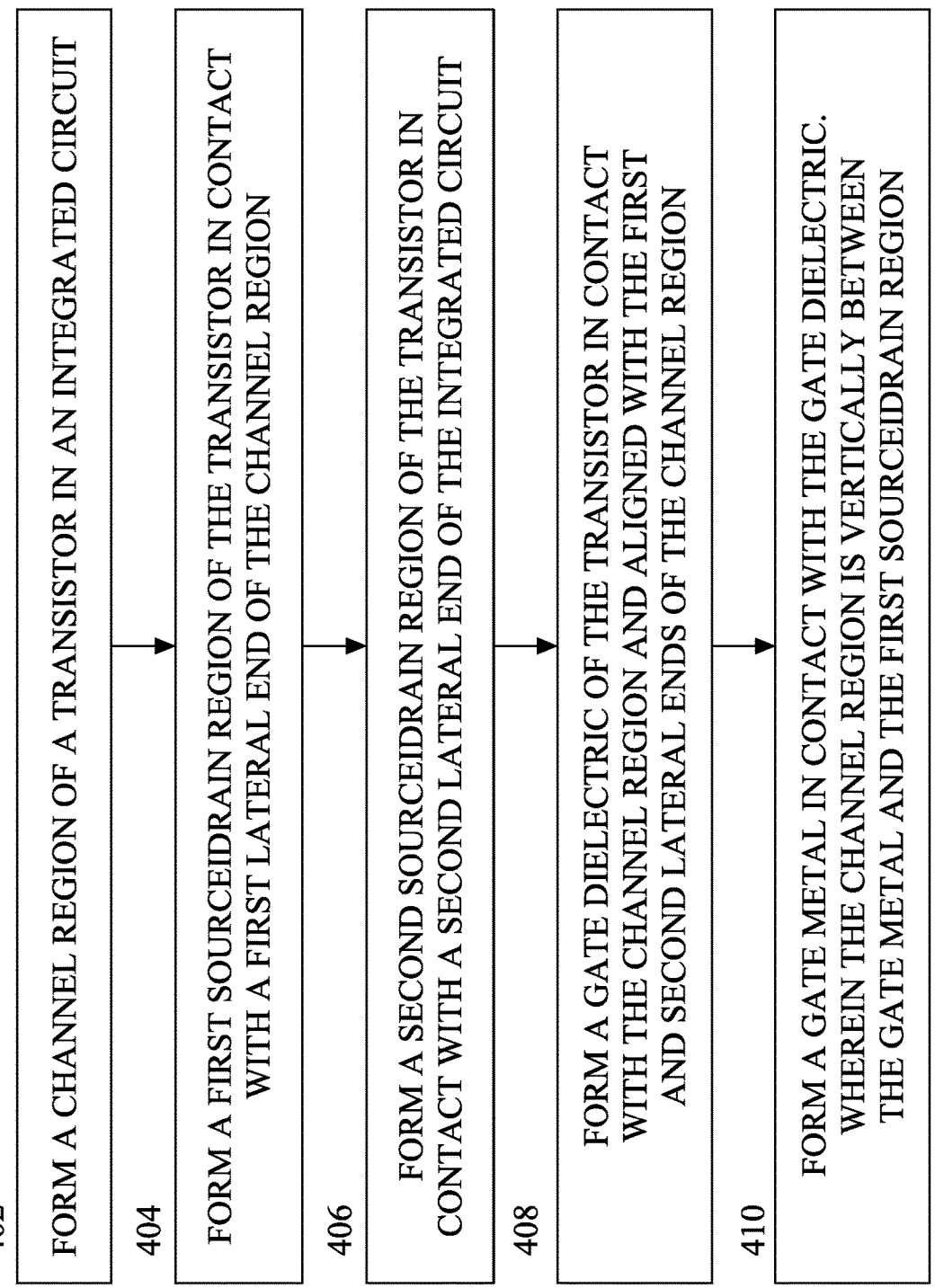
FIG. 4 is a flow diagram of a process for forming an integrated circuit, in accordance with some embodiments.

FIG. 4 is a flow diagram of a method 400 for forming an integrated circuit, in accordance with some embodiments. The method 400 can utilize processes, structures, and components described in relation to FIGS. 1A-3F. At 402, the method 400 includes forming a channel region of a transistor in an integrated circuit. One example of an integrated circuit is the integrated circuit 100 of FIG. 1A. One example of a transistor is the transistor 102 of FIG. 1A. One example of a channel region is the channel region 106 of FIG. 1A. At 404, the method 400 includes forming a first source/drain region of the transistor in contact with a first lateral end of the channel region. One example of a first source/drain region is the source/drain region 108 of FIG. 1A. One example of a first lateral end is the left lateral end 107 of FIG. 1A. At 406, the method 400 includes forming a second source/drain region of the transistor in contact with a second lateral end of the integrated circuit. One example of a second source/drain region is the second source/drain region 110 of FIG. 1A. One example of a second lateral end is the right lateral end 107 of FIG. 1A. At 408, the method 400 includes forming a gate dielectric of the transistor in contact with the channel region and aligned with the first and second lateral ends of the channel region. One example of a gate dielectric is the gate dielectric 112 of FIG. 1A. At 410, the method 400 includes forming a gate metal in contact with the gate dielectric, wherein the channel region is vertically between the gate metal and the first source/drain region. One example of a gate metal is the gate metal 104 of FIG. 1A.

Figure 5:
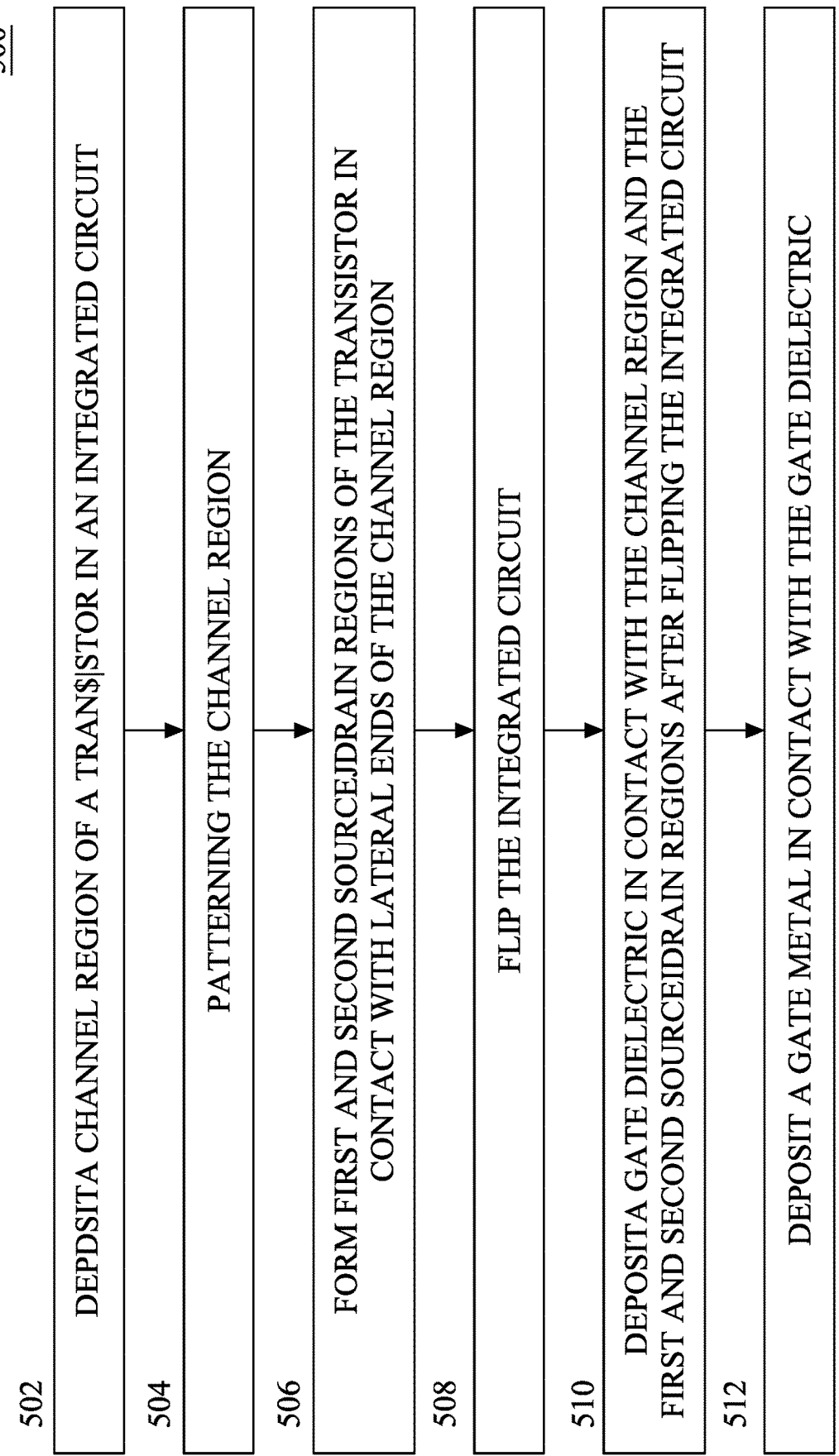
FIG. 5 is a flow diagram of a process for forming an integrated circuit, in accordance with some embodiments.

FIG. 5 is a flow diagram of a method 500 for forming an integrated circuit, in accordance with some embodiments. The method 500 can utilize processes, structures, and components described in relation to FIGS. 1A-3F. At 502, the method 500 includes depositing a channel region of a transistor in an integrated circuit. One example of an integrated circuit is the integrated circuit 100 of FIG. 1A. One example of a transistor is the transistor 102 of FIG. 1A. One example of a channel region is the channel region 106 of FIG. 1A. At 504, the method 500 includes patterning the channel region. At 506, the method 500 includes forming first and second source/drain regions of the transistor in contact with lateral ends of the channel region. One example of first and second source/drain regions are the source/drain regions 108 and 110 of FIG. 1A. One example of lateral ends are the lateral ends 107 of FIG. 1A. At 508, the method 500 includes flipping the integrated circuit. At 510, the method 500 includes depositing a gate dielectric in contact with the channel region and the first and second source/drain regions after flipping the integrated circuit. One example of a gate dielectric is the gate dielectric 112 of FIG. 1A. At 512, the method 500 includes depositing a gate metal in contact with the gate dielectric.

Embodiments of the present disclosure provide an integrated circuit with 2D transistors having robust electrical characteristics. The channel region and the gate electrode of each transistor are self-aligned with each other. The process for forming a self-aligned gate electrode and channel region also results in a tightly controlled amount of overlap of the gate electrode and the source/drain regions of each transistor. The process can be selected to provide transistors with symmetrical overlap of the gate electrode with the source/drain regions or with an asymmetrical overlap of the gate electrode with the source/drain regions.

Accordingly, embodiments of the present disclosure provide an integrated circuit with transistors having reduced amounts of induced charges in the overlap region of the gate electrode and the source/drain regions. Furthermore, the effective channel length can be carefully controlled, thereby providing high quality performance of the transistors. The result is higher performing transistors, fewer scrapped wafers, and overall improved wafer yields.

In some embodiments, an integrated circuit includes. The transistor includes a transistor including a first source/drain region, a second source/drain region, and a two dimensional channel region extending between the first source/drain region and the second source/drain region and having a first lateral end on the first source/drain region and a second lateral end on the second source/drain region. The transistor includes a gate dielectric on the channel region and having a lateral surface that is substantially coplanar with the first lateral end of the channel region and a gate metal on the gate dielectric and laterally bounded by the gate dielectric.

In some embodiments, a method includes forming a channel region of a transistor in an integrated circuit, forming a first source/drain region of the transistor in contact with a first lateral end of the channel region, and forming a second source/drain region of the transistor in contact with a second lateral end of the integrated circuit. The method includes forming a gate dielectric of the transistor in contact with the channel region and aligned with the first and second lateral ends of the channel region and forming a gate metal in contact with the gate dielectric, wherein the channel region is vertically between the gate metal and the first source/drain region.

In some embodiments, a method includes depositing a channel region of a transistor in an integrated circuit, patterning the channel region, and forming first and second source/drain regions of the transistor in contact with lateral ends of the channel region. The method includes flipping the integrated circuit, depositing a gate dielectric in contact with the channel region and the first and second source/drain regions after flipping the integrated circuit, and depositing a gate metal in contact with the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a channel region of a transistor in an integrated circuit;
    forming a first source or drain region of the transistor in contact with a first lateral end of the channel region;
    forming a second source or drain region of the transistor in contact with a second lateral end of the channel region;
    forming a gate dielectric of the transistor in contact with the channel region and aligned with the first and second lateral ends of the channel region; and
    forming a gate metal in contact with the gate dielectric, wherein the channel region is vertically between the gate metal and the first source or drain region.

2. The method of claim 1, further comprising flipping the integrated circuit between forming the first source or drain region and forming the gate metal.

3. The method of claim 1, further comprising:
    forming the channel region by depositing the channel region on a substrate;
    forming a first trench and a second trench in the channel region and the substrate;
    forming a dielectric layer in the first and second trenches; and
    forming the first source or drain region in the first trench on the dielectric layer and in contact with the channel region and a second source or drain region in the second trench on the dielectric layer and in contact with the channel region by depositing a metal in the first and second trenches.

4. The method of claim 3, comprising:
    flipping the integrated circuit after forming the first and second source or drain regions;
    removing the substrate after flipping the integrated circuit;
    forming the gate dielectric by depositing the gate dielectric on the channel region and the dielectric layer after removing the substrate; and
    forming the gate metal by depositing the gate metal on the gate dielectric.

5. The method of claim 1, wherein the gate metal laterally overlaps the first and second source or drain regions by a substantially equal amount.

6. The method of claim 1, wherein the gate metal laterally overlaps the first source or drain region by a larger amount than the second source or drain region.

7. A method, comprising:
    depositing a channel region of a transistor in an integrated circuit;
    patterning the channel region;
    forming first and second source or drain regions of the transistor in contact with lateral ends of the channel region;
    flipping the integrated circuit;
    depositing a gate dielectric in contact with the channel region and the first and second source or drain regions after flipping the integrated circuit; and
    depositing a gate metal in contact with the gate dielectric.

8. The method of claim 7, wherein the channel region is a two dimensional channel region.

9. The method of claim 7, wherein the channel region includes carbon nanotubes.

10. A method, comprising:
    forming a first source or drain region of a transistor;

forming a second source or drain region of the transistor;

forming a two dimensional channel region of the transistor extending between the first source or drain region and the second source or drain region and having a first lateral end on the first source or drain region and a second lateral end on the second source or drain region;

forming a gate dielectric on the channel region and having a lateral surface that is substantially coplanar with the first lateral end of the channel region; and forming a gate metal on the gate dielectric and laterally bounded by the gate dielectric, wherein the gate metal vertically overlaps the first second source or drain region and the second source or drain region.

11. The method of claim 10, wherein the gate metal laterally overlaps the first and second source or drain regions by a substantially equal amount.

12. The method of claim 10, wherein the gate metal laterally overlaps the first and second source or drain regions by between 1 nm and 30 nm.

13. The method of claim 10, wherein the gate metal laterally overlaps the first source or drain region by a larger amount than the second source or drain region.

14. The method of claim 13, wherein the gate metal laterally overlaps the first source or drain region by between 1 nm and 30 nm, wherein the gate metal laterally overlaps the second source or drain region by less than 25 nm.

15. The method of claim 13, wherein the first source or drain region is a source region, wherein the second source or drain region is a drain region.

16. The method of claim 10, wherein:

the first source or drain region has a first step structure including a horizontal surface and a vertical surface;

the channel region is positioned on the horizontal surface of the first step structure; and the first lateral end of the channel region abuts the vertical surface of the first step structure.

17. The method of claim 16, wherein the gate dielectric abuts the vertical surface of the first step structure.

18. The method of claim 16, wherein:

the second source or drain region has a second step structure including a horizontal surface and a vertical surface;

the channel region is positioned on the horizontal surface of the second step structure; and the second lateral end of the channel region abuts the vertical surface of the second step structure.

19. The method of claim 10, wherein the channel region is positioned vertically between the gate metal and the first source or drain region.

20. The method of claim 10, further comprising:

forming a first conductive via below and in contact with the first source or drain region; and forming a second conductive via above and in contact with the gate metal.

* * * * *